United States Patent [19]

Ishida et al.

[11] Patent Number: 5,474,615
[45] Date of Patent: Dec. 12, 1995

[54] METHOD FOR CLEANING SEMICONDUCTOR DEVICES

[75] Inventors: Tomoaki Ishida; Kenji Kawai; Moriaki Akazawa; Takahiro Maruyama; Toshiaki Ogawa, all of Hyogo, Japan

[73] Assignee: Mitsubishi Denki Kabushiki Kaisha, Tokyo, Japan

[21] Appl. No.: 993,514

[22] Filed: Dec. 17, 1992

Related U.S. Application Data

[63] Continuation of Ser. No. 656,316, Feb. 19, 1991, abandoned.

[30] Foreign Application Priority Data

Mar. 9, 1990 [JP] Japan ................................ 2-059304

[51] Int. Cl.$^6$ ................................................ C03C 15/00
[52] U.S. Cl. ................................ 134/1.2; 437/225
[58] Field of Search ........................... 437/225, 228; 156/643; 134/1

[56] References Cited

U.S. PATENT DOCUMENTS 4,996,077  2/1991  Moslehi et al. .................... 427/54.1

Primary Examiner—R. Bruce Breneman
Attorney, Agent, or Firm—Lowe, Price, LeBlanc & Becker

[57] ABSTRACT

A method of cleaning semiconductor devices which removes or transmutes the contaminants sticking on sidewalls of a pattern or a trench is formed is disclosed. A substrate to be treated on which a pattern or a trench is formed is located in a processing container. A reactive gas which reacts with the contaminants sticking on the sidewall of the pattern or the trench to produce reactive ions which remove or transmute the contaminants is introduced into the processing container. Plasma of the reactive gas is produced by electronic cyclotron resonance in order to produce reactive ions from the reactive gas introduced into the processing container. According to the method, the temperature of the reactive ions in the plasma becomes high, with the result that the motion of the reactive ions in the plasma becomes more active. Accordingly, a velocity vector in a horizontal direction of the reactive ions becomes larger, which enables efficient removal or change in quality of the contaminants sticking on the sidewalls of the pattern or the trench.

10 Claims, 9 Drawing Sheets

METHOD FOR CLEANING SEMICONDUCTOR DEVICES

This application is a continuation of application Ser. No. 07/656,316, filed Feb. 19, 1991, now abandoned.

BACKGROUND OF THE INVENTION

1. Field of the Invention

The present invention generally relates to a method of cleaning semiconductor devices, and more particularly to a method of cleaning semiconductor devices in which contaminants sticking on sidewalls of patterns or trenches are effectively removed or changed in quality. The present invention further relates to apparatus for implementing such a cleaning method.

2. Description of the Background Art

A step of etching process for forming fine interconnection patterns is included in a process for manufacturing semiconductor devices. In this etching process, the plasma etching employing plasma of reactive gas or the reactive ion etching (referred to as "RIE" hereinafter) is widely introduced at present.

FIG. 7 is a schematic view of a conventional RIE apparatus.

Referring to FIG. 7, the processing apparatus has a hollow processing container 10. In processing container 10, a plate high-frequency electrode 11 and a plate high-frequency electrode 12 are provided facing to each other in parallel. An exhaust port 8 for exhausting the gas in the processing container 10 to implement a vacuum condition therein is provided in a lower portion of processing container 10. A gas introducing port 7 for introducing a reactive gas into processing container 10 is provided in the upper portion of processing container 10. One output of a high-frequency power source 13 is directly connected to plate high-frequency electrode 11 provided in the upper portion. The other output of high-frequency power source 13 is connected to plate high-frequency electrode 12 provided in the lower portion through a capacitor 14. A substrate to be treated 4 is located on plate high-frequency electrode 12 provided in the lower portion.

Next, operation for etching an aluminum alloy film to form an interconnection pattern employing the above RIE apparatus will be described.

FIGS. 8A–8C are sectional views showing the steps for forming an interconnection pattern on the semiconductor substrate.

Referring to FIG. 8A, a silicon oxide film 17 is formed on a semiconductor substrate 18. An aluminum alloy film 16 to be an interconnection pattern is formed on silicon oxide film 17. A resist pattern 15 with a pre-determined shape is formed on aluminum alloy film 16.

The obtained substrate to be treated 4, referring to FIG. 7, is located on plate high-frequency electrode 12 provided in the lower portion. Next, chlorine type reactive gas (for example, $BCl_3$, $SiCl_4$, $Cl_2$, $CCl_4$ etc.) is introduced in processing container 10 through gas introducing opening 7, and in the meanwhile, the gas is exhausted through exhaust port 8. By this operation, the interior of processing container 10 is maintained at a predetermined pressure. In this condition, when high-frequency power source 13 is turned on, a high-frequency voltage is applied between plate high-frequency electrode 11 and plate high-frequency electrode 12. Upon application of the high-frequency voltage, plasma of a chlorine type reactive gas is produced between plate high-frequency electrode 11 and plate high-frequency electrode 12 to form a plasma region 21 in processing container 10. When the above-described condition is implemented in processing container 10, plate high-frequency electrode 12 on which substrate to be treated 4 is carried is negatively charged. Then, a strong electric field region referred to as a sheath region 22 is produced between plasma region 21 and plate high-frequency electrode 12. The velocity at which the reactive ions produced in the plasma advance downwardly is accelerated by the electric field of this sheath region 22 in impinging onto plate high-frequency electrode 12 and substrate to be treated 4. Referring to FIG. 8B, aluminum alloy film 16 is gradually etched by the incident reactive ions to form an interconnection pattern 16a of a condition in which etching is completed, referring to FIG. 8C.

In the above-described steps, referring to FIGS. 8B and 8C, deposition films 19 mainly composed of products of the etching reaction are formed on sidewalls of interconnection pattern 16a. If chlorine type gas such as $BCl_3$, $SiCl_4$, $Cl_2$, $CCl_4$ is employed as a reactive gas, deposition films 19 composed of complicatedly mixed aluminum chloride, carbon, silicon and so forth are formed. If the substrate to be treated 4 in the conditions of FIG. 8C, that is, on which deposition films 14 are formed, is left in the air, a serious problem is produced. This is because, with this deposition film 19 including a large amount of chlorine compounds, the chlorine compounds react with moisture in the air to produce HCl. If HCl is produced on sidewalls of interconnection pattern 16a formed of aluminum alloy, corrosion of the aluminum is produced. The speed of the corrosion is so fast that an interconnection pattern of a width of several μm is cut off only in several minutes in the worst case. Therefore, to prevent this corrosion, it is necessary to sufficiently remove the chlorine compounds sticking on sidewalls of interconnection pattern 6a or change their qualities into other substances which do not cause corrosion.

Next, a conventional method for preventing corrosion of sidewalls of resist patterns will be described.

Referring to FIGS. 8C and 7, after etching, a substrate to be treated 4 is not taken out into the air soon and the gas in processing container 10 is sufficiently exhausted. After that, fluorine type gas such as $CF_4$ is introduced into processing container 10 through gas introducing opening 7 to produce plasma by a method similar to that in etching. Then, fluorine ions are directed onto the surface of substrate to be treated 4, and the chlorine of the chlorine compounds existing in deposition films 19 is replaced by the fluorine. Once the chlorine in the chlorine compounds is replaced by fluorine, the reaction with the moisture in the air does not produce HCl no longer. Consequently, the interconnection pattern is prevented from corroding.

However, the conventional method for preventing corrosion of sidewalls of resist patterns also employed the plasma processing apparatus provided with parallel plate electrodes shown in FIG. 7, so that it was difficult to directly direct reactive ions onto the sidewalls of resist pattern 16a. The reason thereof will be described next. That is, referring to FIG. 3B, the apparent velocity vector 25 of the reactive ions ($CF_3^+$) is determined by a sum of the velocity vector 23 of the reactive ions in plasma region 21 and the velocity vector 24 the reactive ions accelerated in the sheath region 22 obtained. While the former velocity vector 23 has random directionality, the latter velocity vector 24 is vertical to substrate to be treated 4. In the RIE, the temperature of the ions in the plasma is low, so that the former is much smaller than the latter, so that the reactive ions vertically impinge onto the surface of substrate to be treated 4. Therefore, ions do not directly impinge on sidewalls of resist pattern 16a. Referring to FIG. 8C, if ions ($CF_3^+$) do not directly impinge on the sidewalls of resist pattern 16a, removal or change in quality of deposition films 19 is not performed sufficiently. Accordingly, troubles such as cut off of the interconnection pattern as described above have been caused.

As for prior art which relates to the present invention, in Japanese Patent Laying-Open No. 63-117426, a technique of employing electronic cyclotron resonance to produce ultra violet light which is employed to cleaning surfaces of substrates to be treated is disclosed. However, this method also had a problem that contaminants sticking on sidewalls of a resist pattern are not sufficiently removed, as an ultra violet light having the property of going straight is directed to the substrate to be treated.

SUMMARY OF THE INVENTION

Accordingly, it is an object of the present invention to provide a method of cleaning semiconductor devices in which contaminants sticking on sidewalls of a pattern are efficiently changed in quality.

It is another object of the present invention to provide a method of cleaning semiconductor devices in which contaminants sticking on sidewalls of a pattern are efficiently removed.

It is still another object of the present invention to provide a method of cleaning semiconductor devices in which contaminants sticking on sidewalls of trenches are efficiently removed or changed in quality.

It is yet another object of the present invention to provide a method of cleaning semiconductor devices in which contaminants sticking on sidewalls of a through hole are efficiently removed.

It is a still yet object of the present invention to provide an apparatus for cleaning semiconductor devices in which contaminants sticking on sidewalls of a pattern are efficiently removed or changed in quality.

It is still another object of the present invention to provide a semiconductor manufacturing apparatus in which cleaning can be continuously performed without taking out semiconductor substrates into the air after etching process.

The method of cleaning semiconductor devices according to the present invention is a method for removing and changing in quality contaminants sticking on sidewalls of a pattern or a trench in order to achieve the above-described objects. A substrate to be treated on which patterns or trenches are formed is located in a processing container. Into the processing container, reactive gas producing reactive ions which react with contaminants sticking on sidewalls of the pattern or the trench to remove the contaminants or change the quality of the contaminants is introduced. Plasma of the reactive gas is produced in order to produce reactive ions from the reactive gas introduced into the processing container by electronic cyclotron resonance.

According to a preferable embodiment of the method for cleaning semiconductor devices of this invention, xenon or krypton is introduced into the processing container together with the above reactive gas. Then, by the above electronic cyclotron resonance, plasma of the mixed gas of the above reactive gas and the above xenon or krypton is produced.

The reactive gas employed in the present invention preferably includes compounds including atoms selected from the group consisting of fluorine, chlorine, bromine and iodine.

In the present invention, the step of producing plasma of reactive gas by electronic cyclotron resonance includes the step of supplying a microwave into the processing container in which the reactive gas is introduced and the step for producing a magnetic field in the processing container.

The apparatus for cleaning semiconductor devices according to another aspect of the present invention includes an apparatus for removing the contaminants or changing the property of the contaminants sticking on sidewalls of patterns or trenches. The cleaning apparatus has a processing container for accommodating a substrate to be treated on which patterns or trenches are formed. In the processing container, a reactive gas supply means for supplying into the processing container reactive gas producing reactive ions which react with the contaminants sticking on the sidewalls of the pattern or trench to remove or transmute the contaminants is provided. The apparatus further includes means for producing plasma of the reactive gas by electronic cyclotron resonance in order to produce reactive ions from the reactive gas introduced into the processing container.

In the present invention, the means for producing plasma of the said reactive gas by electronic cyclotron resonance includes means for supplying a micro wave into the said processing container and means for producing a magnetic field in the said processing container.

According to the method for cleaning semiconductor devices of the present invention, the plasma of the reactive gas is produced by electronic cyclotron resonance, so that the temperature of the reactive ions in the plasma becomes higher as compared with the case of the plasma obtained in a conventional plasma processing apparatus having parallel plate electrodes, which results in more active motion of the reactive ions in the plasma. Therefore, referring to FIG. 3A, the velocity vector 23 of the reactive ion ($CF_3^+$) in plasma region 21 becomes larger, with the result that the apparent velocity vector 25 of the reactive ion is a vector directed obliquely downwards. Therefore, the reactive ion can directly impinge on the sidewalls of the pattern. As a result, the contaminants sticking on the sidewalls of the pattern or the trench can be efficiently removed or transmuted.

According to a cleaning apparatus of semiconductor devices according to another aspect of the present invention, since it has reactive gas supply means for supplying reactive gas and means for producing plasma of the above reactive gas by electronic cyclotron resonance to produce reactive ions from the reactive gas introduced into the processing container, the plasma of the reactive gas can be produced by the electronic cyclotron resonance. Accordingly, as compared to a case of plasma obtained in a conventional plasma processing apparatus provided with parallel plate electrodes, the temperature of the reactive ions in the plasma can be made higher, with the result that the motion of the reactive ions in the plasma becomes more active. Accordingly, referring to FIG. 3A, the velocity vector 23 in plasma region 21 becomes larger, resulting in that the apparent velocity vector 25 of the reactive ions is a vector directed obliquely downwards. Therefore, the ions directly impinge on the sidewalls of the pattern. As a result, the contaminants sticking on the sidewalls of the pattern or the trench can be efficiently removed or transmuted.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described below referring to figures.

Figure 1:
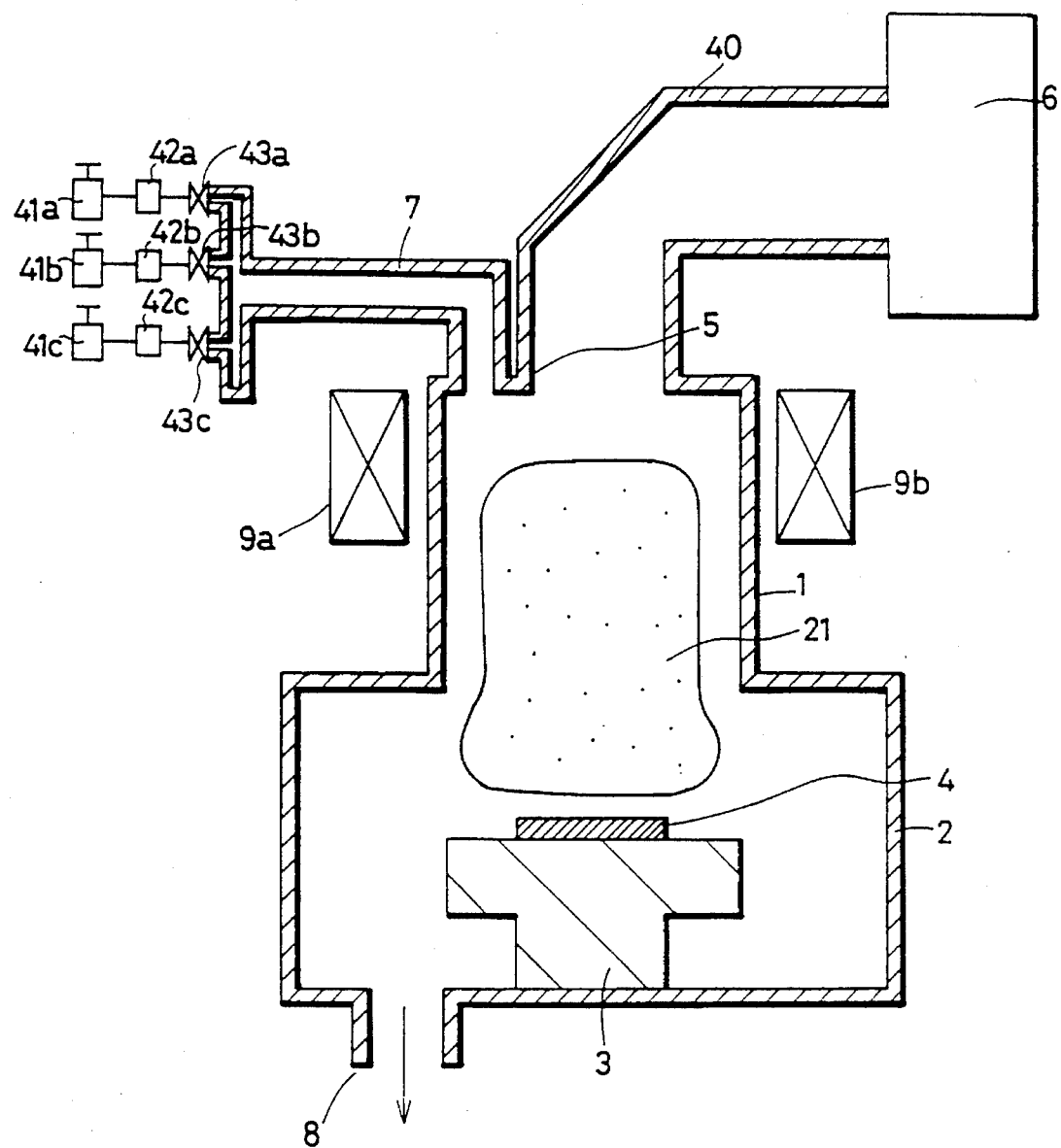
FIG. 1 is a schematic diagram of an apparatus for cleaning according to one embodiment of the present invention.

FIG. 1 is a schematic diagram showing a cleaning apparatus of semiconductor devices according to one embodiment of the present invention.

The cleaning apparatus has a sample chamber 2 for accommodating a substrate to be treated 4. In the sample chamber 2, a sample shelf 3 on which substrate to be treated 4 is located is provided. In the upper portion of the sample chamber 2, a plasma producing chamber 1 for producing plasma therein is connected. A microwave introducing opening 5 is provided in the upper portion of plasma producing chamber 1. The microwave source 6 is connected to microwave introducing opening 5 through a wave guide 40. Microwave source 6 is, for example, a magnetron or a klystron. Magnetic coils 9a, 9b for producing a magnetic field in plasma producing chamber 1 are provided around plasma producing chamber 1. A gas introducing tube 7 is connected to the upper portion of plasma producing chamber 1. A bomb 41a filled with reactive gas is connected to gas introducing tube 7 through a mass flow controller 42a and valve 43a. A bomb 41b filled with krypton or xenon is also connected to gas introducing tube 7 through a mass flow controller 42b and valve 43b. Furthermore, an auxiliary bomb 41c filled with fluorine, nitrogen, hydrogen or ammonia is connected to gas introducing tube 7 through a mass flow controller 42c and a valve 43c. An exhaust port 8 for exhausting gas inside simple chamber 2 is provided in the lower portion of sample chamber 2.

Next, a method for transmuting the contaminants sticking on the sidewalls of a pattern employing the above-described cleaning apparatus will be described.

FIGS. 2A–2E are sectional views showing the steps of a method for forming an interconnection pattern on a semiconductor substrate including steps for transmuting the contaminants sticking on sidewalls of a pattern.

Figure 2A:
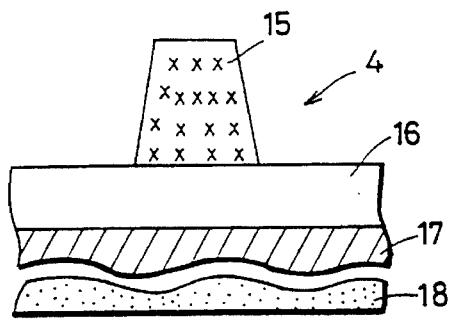
FIGS. 2A–2E are sectional views of the steps for forming an interconnection pattern on a semiconductor substrate.
Figure 2D:
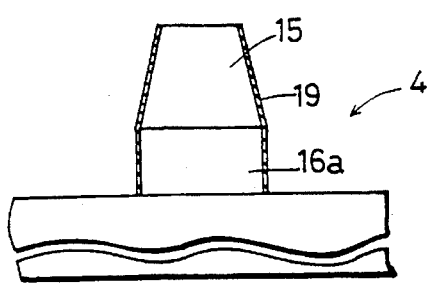
Figure 2B:
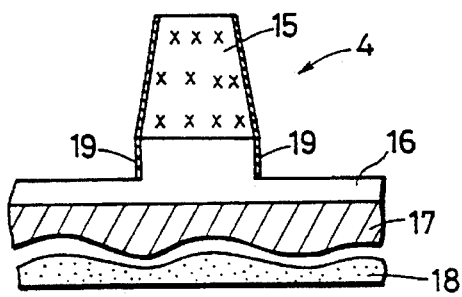
Figure 2E:
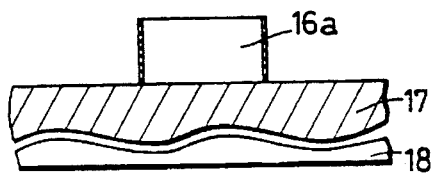
Figure 2C:
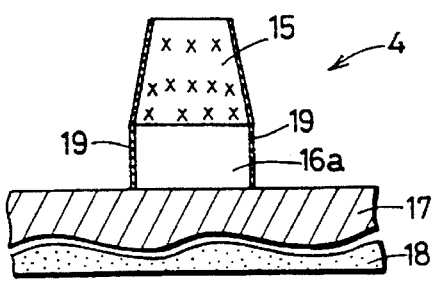
Figure 7:
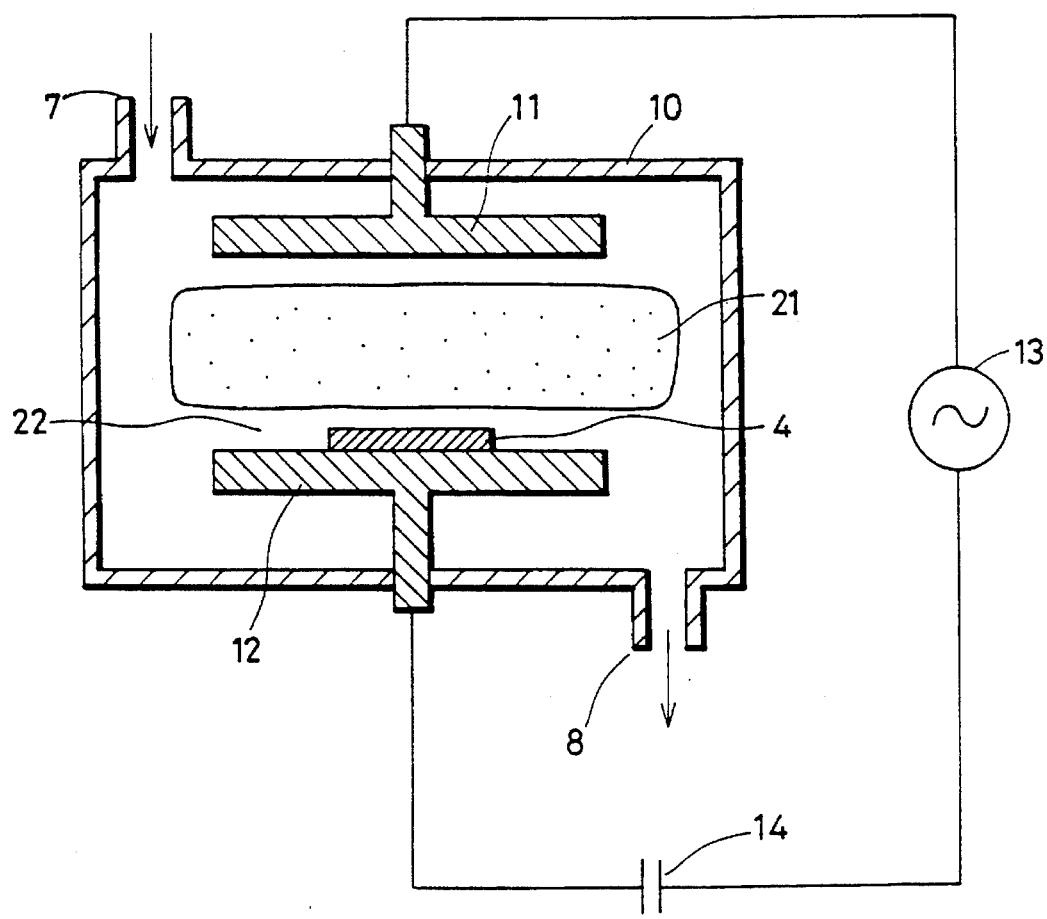
FIG. 7 is a schematic diagram of a conventional reactive ion etching apparatus.
Figure 8A:
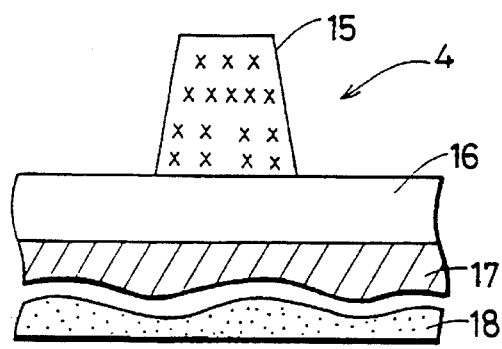
FIGS. 8A–8C are sectional views of the conventional steps for forming an interconnection pattern on a semiconductor substrate.
Figure 8B:
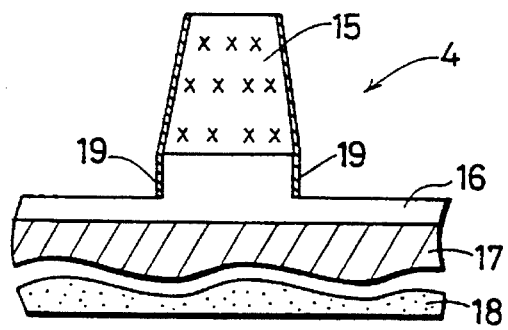
Figure 8C:
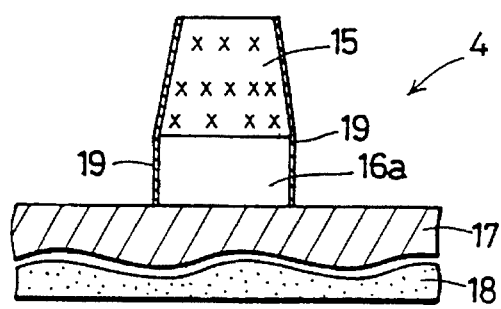

The steps shown in FIGS. 2A–2C are same as the steps shown in FIGS. 8A–8C, which are implemented employing a RIE apparatus as shown in FIG. 7, for example. Since the process has already been described in the description of FIGS. 8A–8C, the same reference numerals are assigned to the same or corresponding portions and the description thereof is not repeated.

Next, referring to FIGS. 2C and 1, a substrate to be treated 4 provided with an interconnection pattern 16a on which sidewalls deposition films 19 stick is carried on a sample shelf 3. Next, the gas inside plasma producing chamber 1 and sample chamber 2 is sufficiently exhausted from exhaust port 8. Subsequently, valve 43a is opened and the reactive gas is introduced into plasma producing chamber 1 from bomb 41a for reactive gas. Simultaneously, valve 43b is opened to introduce xenon into plasma producing chamber 1 from bomb 41b. The introduced amount of xenon is about 25–75% of the reactive gas, which will be described later in more detail referring to data. The reactive gas is a compound including fluorine element such as $CF_4$, $SF_6$, $NF_3$, $CHF_3$, for example. Also, krypton may be employed instead of xenon. Simultaneously with introducing the reactive gas and xenon into plasma producing chamber 1, the gas is sucked from exhaust port 8. By this operation, inside of plasma producing chamber 1 and sample chamber 2 is maintained at a predetermined pressure (preferably, below 10 Torr). In this condition, a magnetic field is produced in plasma producing chamber 1 by magnetic coils 9a, 9b. A microwave is supplied into plasma producing chamber 1 through wave guide 40 from microwave source 6. The strength of the magnetic field is 875 gauss, for example, and then the frequency of the microwave is 2.45 GHz, for example. In this way, the electrons in the reactive gas absorb energy from the microwave to ionize the gas molecules. This is called electronic cyclotron resonance, which produces plasma region 20 in plasma producing chamber 1. If the reactive gas is $CF_4$, the following reactive ions are produced.

$$CF_4 \rightarrow CF_4^+ + CF_3^+ + F^+ \ldots$$

Figure 3A:
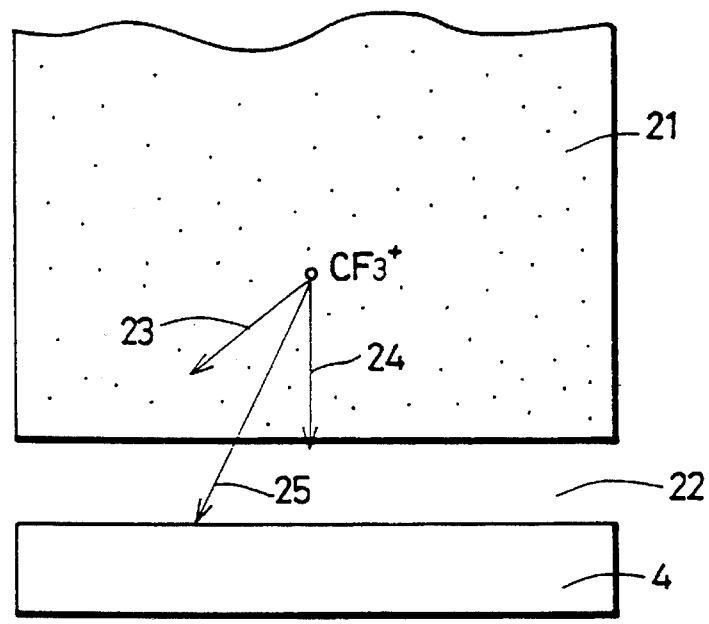
FIG. 3A is a diagram showing directionality of a reactive ion obtained by the electronic cyclotron resonance.

FIG. 3A is a diagram showing the directionality of the reactive gas ions ($CF_3^+$) produced by the electronic cyclotron resonance. In FIG. 3A, the members or elements designated by reference numerals 4, 21–25 are completely same as those described in FIG. 3B, so that the description thereof is not repeated here.

Figure 9A:
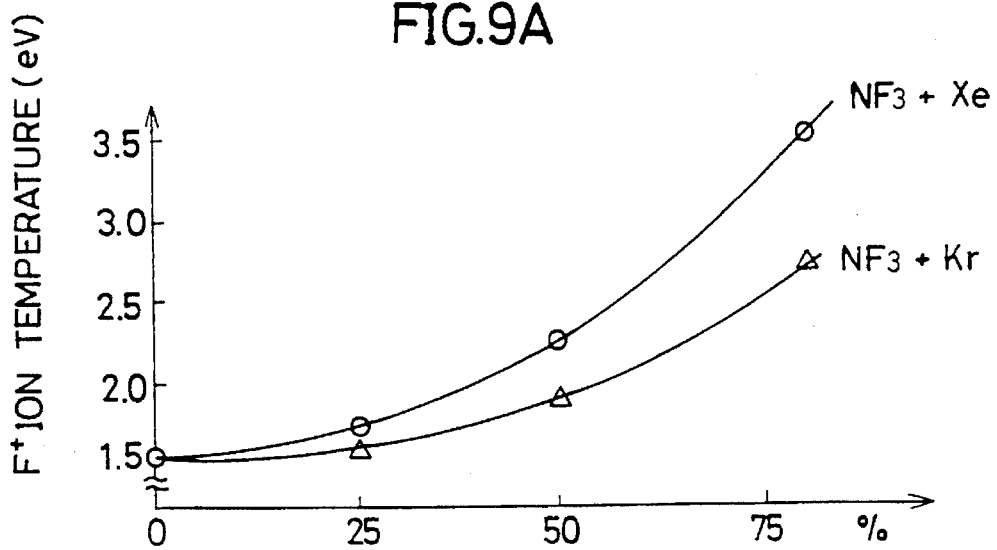
FIG. 9A is a relational diagram of the ion temperature and the content of Xe(or Kr) when Xe (or Kr) is added to $NF_3$.
Figure 9B:
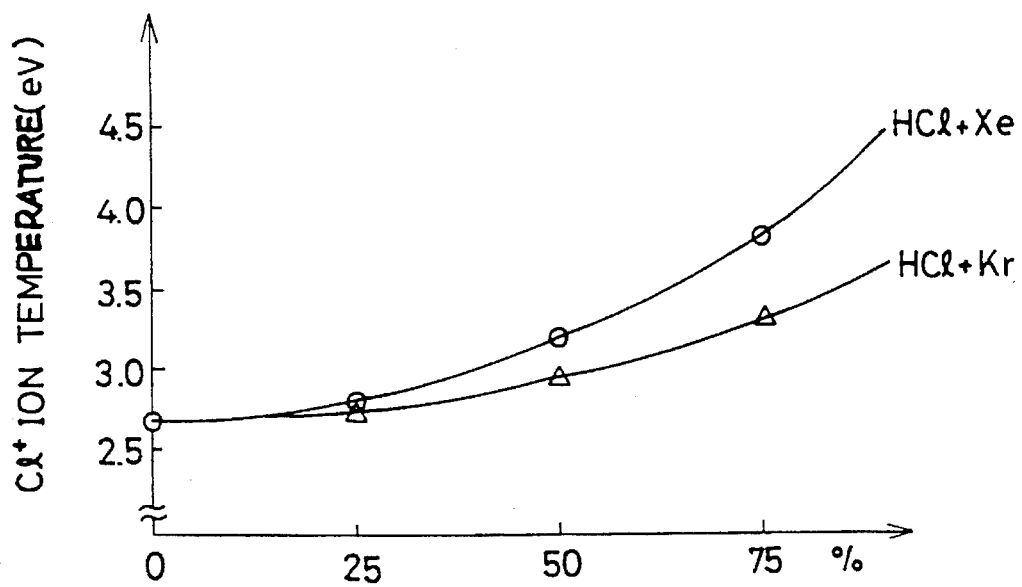
FIG. 9B is a relational diagram of the ion temperature and the content of Xe(or Kr) when Xe(or Kr) is added to HCl.
Figure 9C:
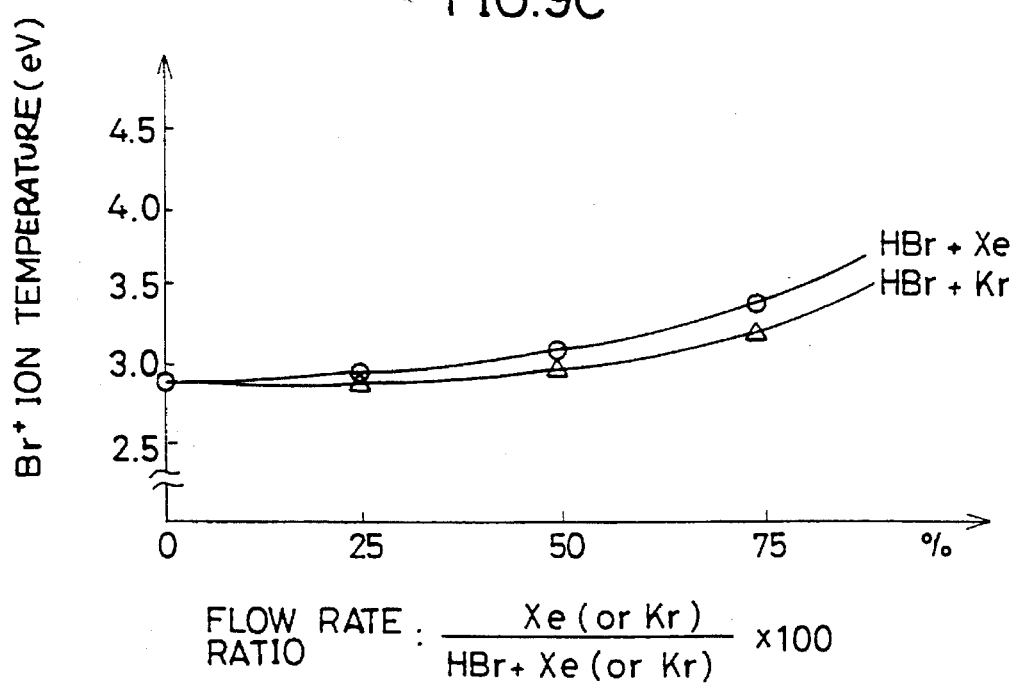
FIG. 9C is a relational diagram of the ion temperature and the content of Xe (or Kr) when Xe (Kr) is added to XBr.
Figure 9D:
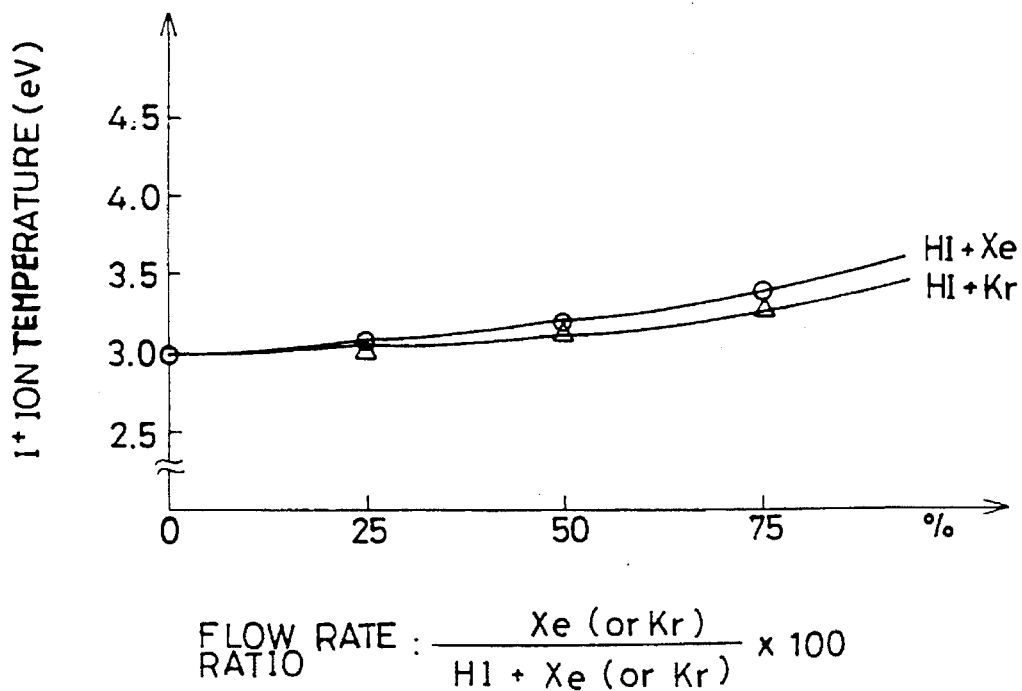
FIG. 9D is a relational diagram of the ion temperature and the content of Xe (or Kr) when Xe (Kr) is added to HI.

Generally, the temperature of the ions in the plasma produced by the electronic cyclotron resonance is considerably higher (about 2 eV) than that of ions in the plasma produced by a RIE apparatus (about 0.5 eV). Although the reason is not clearly understood, if krypton or xenon is mixed into reactive gas, the ion temperature further increases (about 4 eV). FIG. 9A is a relational diagram of the ion temperature and the content (expressed in the flow rate ratio) of Xe (or Kr) in case where Xe (or Kr) is added to $NF_3$. As clearly seen from the figure, if Xe (or Kr) is added to $NF_3$, it is recognized that the ion temperature increases. From the figure, it is determined that the flow rate ratio of Xe (or Kr) is preferably 25–75%. The data is obtained under conditions of a gas pressure 0.8 m Torr, a microwave power 400 W. Referring to FIGS. 9B–9D, even when employing HCl, HBr, HI, similar results were obtained.

Figure 3B:
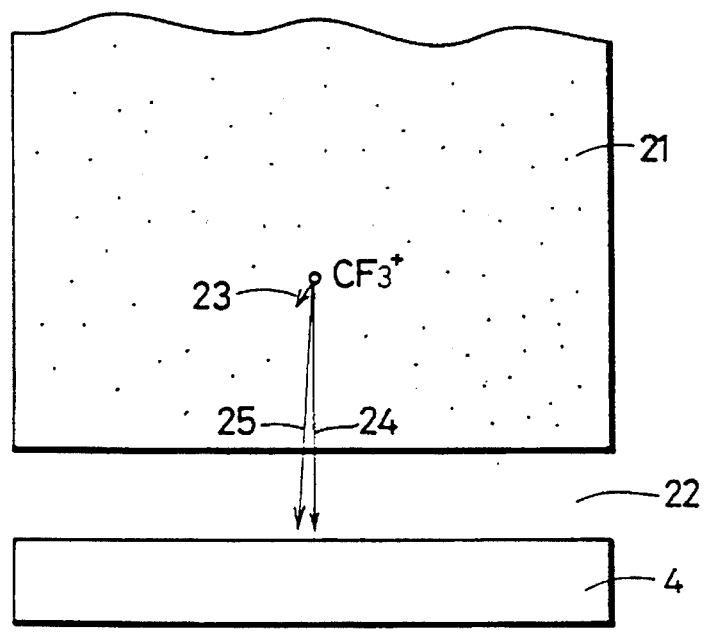
FIG. 3B is a diagram showing directionality of a reactive ion produced by a RIE apparatus.

Now, apparent velocity vector 25 of a reactive ion ($CF_3^+$) is determined by a sum of velocity vector 23 of the reactive ion in plasma region 21 and velocity vector 24 which the reactive ion accelerated in sheath region 22 obtained. As shown in FIG. 3B, since the temperature of the reactive ions in the plasma in a conventional RIE apparatus is low, the velocity vector 23 is much smaller than the velocity vector 24. Accordingly, the reactive ions ($CF_3^+$) impinge vertically to the surface of substrate to be treated 4.

Conversely, referring to FIG. 3A, since the ion temperature of the reactive ions ($CF_3^+$) produced by electronic cyclotron resonance is high, velocity vector 23 becomes larger. As a result, the apparent velocity vector 25 (a vector obtained by adding velocity vector 23 and velocity vector 24) of the reactive ion ($CF_3^+$) becomes a vector directed obliquely downwards. Accordingly, the reactive ion ($CF_3^+$), referring to FIG. 2C, can impinge on sidewalls of the interconnection pattern 16a and the resist 15. Accordingly, referring to FIG. 2D, chlorine atoms in deposition films 19 sticking on sidewalls of interconnection pattern 16a and resist 15 are efficiently replaced by fluorine atoms, so that deposition films 19 change in quality. The transmuted deposition films 19 do not emit HCl even if it reacts with moisture in the air, so that it does not corrode interconnection pattern 16a.

Subsequently, referring to FIGS. 2D and 2E, substrate to be treated 4 is introduced into an ashing apparatus (not shown) to ash and remove resist 15. By this, a semiconductor substrate 18 on which interconnection pattern 16a is formed is obtained.

Now, in the above described embodiment, a case where deposition film 19 is transmuted by employing fluorine type reactive gas has been described, but the present invention is not limited to this. Deposition film 19 can be removed by etching by appropriately selecting reactive gas.

Also, simultaneously with introducing reactive gas into plasma producing chamber 1, $O_2$, $N_2$, $H_2$ or $NH_3$ can be introduced into plasma producing chamber 1 from auxiliary bomb 41c. To mix $O_2$ has an effect that the carbon in deposition film 19 is removed. Mixing $NH_3$ has an effect that chlorine ions are nuetralized. Mixing $N_2$, $H_2$ has an effect that a natural oxide film formed on substrate to be treated 4 is also removed.

Figure 4:
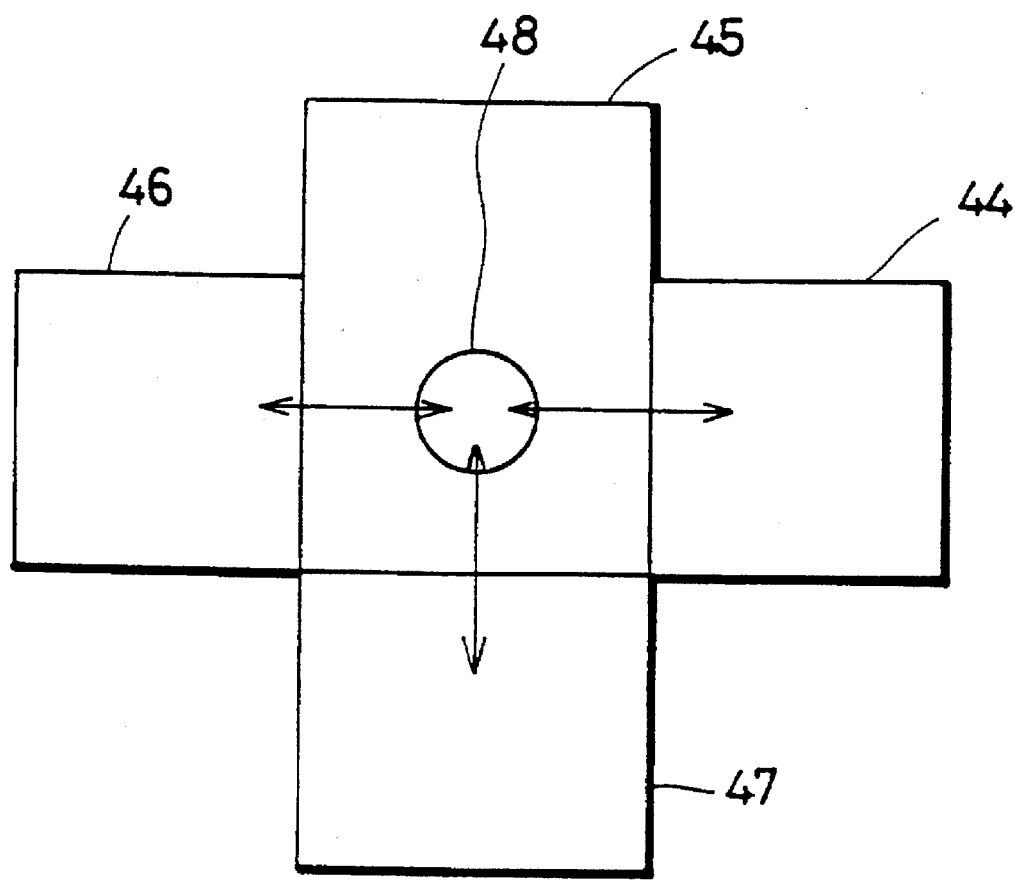
FIG. 4 is a schematic diagram of a semiconductor manufacturing apparatus according to another embodiment of the present invention.

FIG. 4 is a schematic diagram of a semiconductor manufacturing apparatus according to another embodiment of the present invention. In the above-described embodiment, a case where an etching chamber and a cleaning chamber are discrete things spaced apart from each other has been described. In the above-described embodiment, after patterning an aluminum alloy film in the etching chamber, the substrate to be treated is taken out of the etching chamber into the air. Subsequently, introducing the substrate to be treated into a cleaning apparatus, cleaning process has been performed. In this case, there has been a problem that when it is taken out into the air, the deposition film reacts with moisture in the air to produce HCl. The semiconductor manufacturing apparatus shown in FIG. 4 is devised to solve such problems.

The semiconductor manufacturing apparatus has a cleaning chamber 46. In the cleaning chamber 46, the contaminants sticking on sidewalls of a pattern or a trench are removed or transmuted by electronic cyclotron resonance as shown in FIG. 1. A vacuum chamber 45 in which a vacuum condition can be implemented is connected to cleaning chamber 46. An etching chamber 44 in which etching is performed to form patterns or trenches therein is connected to vacuum chamber 45. An ashing chamber 47 in which resists are ashed is connected to vacuum chamber 45. A transmitting means 48 for transmitting the substrate to be treated 4 in a vacuum condition among cleaning chamber 46, vacuum chamber 45, etching chamber 44 and ashing chamber 47 is provided in vacuum chamber 45.

Next, operation of the apparatus will be described.

In etching chamber 44, the cleaning steps shown in FIGS. 2A–2C are performed. Next, with a vacuum condition in vacuum chamber 45, transmitting means 48 is driven to transmit substrate to be treated 4 to vacuum chamber 45, and then, to guide substrate to be treated 4 to cleaning chamber 46. The cleaning step shown in FIG. 2D is performed in cleaning chamber 46. Next, transmitting means 48 is driven to transmit substrate to be treated 4 to vacuum chamber 45 and then guide substrate to be treated 4 to ashing chamber. In ashing chamber 47, the ashing step shown in FIG. 2E is performed. When using this apparatus, the substrate to be treated 4 does not touch moisture in the air when moved from etching chamber 44 to cleaning chamber 46. Accordingly, in transmitting the substrate to be treated, HCl is not produced from the deposition film.

Now, in the above-described embodiment, a cleaning method for removing or transmuting contaminants sticking on sidewalls of an interconnection pattern is illustrated, but the present invention is not limited to this, and it is possible to apply the present invention to a method for removing contaminants sticking on sidewalls of a trench.

Figure 5:
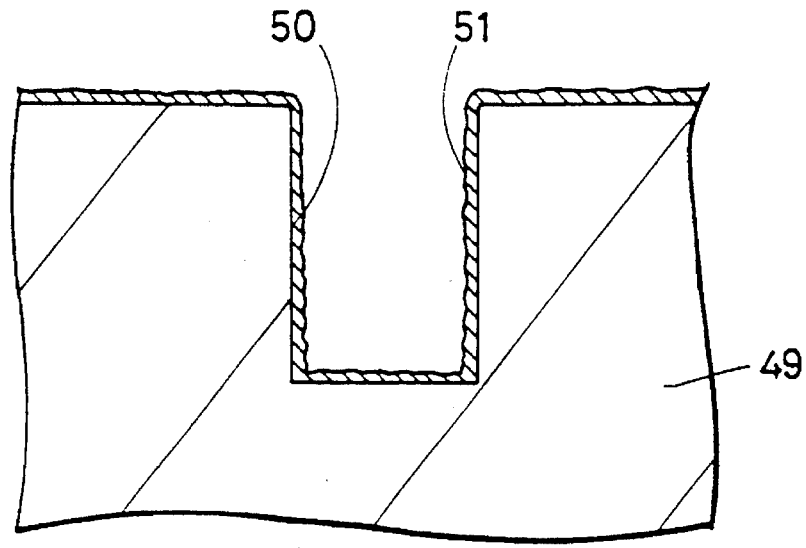
FIG. 5 is a sectional view of another substrate to be treated to which the present invention is applied.

That is, referring to FIG. 5, a trench 50 is formed on silicon substrate 49. A contaminant 51 designated by $SiCl_x$ is formed on the sidewall of trench 50. Such a contaminant 51 sticks on the sidewall of trench 50 because halogen type reactive gas is employed when forming a trench in silicon substrate 49. In order to remove the contaminant 51, silicon substrate 49 is introduced into the cleaning apparatus shown in FIG. 1. Subsequently, upon performing electronic cyclotron resonance employing reactive gas such as $CF_4$ gas, the contaminant 51 sticking on the sidewall of trench 50 become $SiF_4$ to be removed. The mechanism is the same as that described about FIG. 3A, so that the description thereof is not repeated here.

Figure 6:
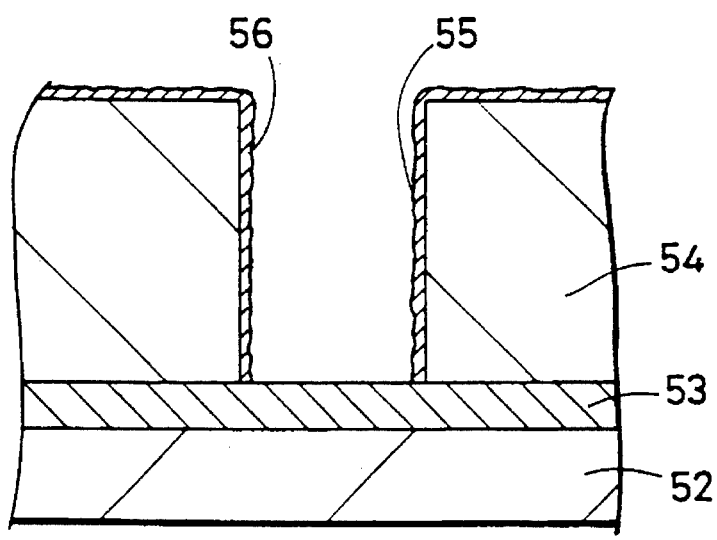
FIG. 6 is a sectional view of still another substrate to be treated to which the present invention is applied.

The present invention also can be applied to removal of contaminants sticking on a sidewall of such a trench as shown in FIG. 6 (in this case, a through hole). Referring to FIG. 6, a first aluminum interconnection layer 53 is formed on substrate 52. A $SiO_2$ film 54 is formed on the first aluminum interconnection layer 53. A through hole 55 for exposing a part of the surface of the first aluminum interconnection layer 53 is formed in $SiO_2$ film 54. When forming through hole 55, contaminant 56 sticks on the sidewall of through hole 55. In order to remove the contaminant 56, substrate 52 is introduced into the cleaning apparatus shown in FIG. 1. Subsequently, performing electronic cyclotron resonance employing reacting gas such as $CF_4$, contaminant 56 sticking on the sidewall of through hole 55 is etching-removed.

Now, in the above described embodiment, a case where a compound including fluorine atoms is used as reactive gas is illustrated, but the present invention is not limited to this, and it may be a compound including chlorine atoms, a compound including bromine atoms or a compound including iodine atoms.

As described above, according to the present invention, plasma of reactive gas is produced by electronic cyclotron resonance, so that the temperature of the reactive ions in the plasma is higher as compared to the plasma obtained in a conventional plasma processing apparatus having parallel plate electrodes. Accordingly, the motion of reactive ions in the plasma becomes more active. Therefore, the velocity vector in a parallel direction of the reactive ions becomes larger, which makes it possible to efficiently remove or transmute contaminants sticking on sidewalls of patterns or trenches.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of cleaning semiconductor devices which selectively removes or transmutes contaminates sticking on a sidewall of a pattern or a trench, comprising the steps of:

locating a substrate to be treated on which said pattern or trench is formed into a processing container;

introducing a reactive gas, into said processing container said reactive gas including an element selected from the group consisting of fluorine, chlorine, bromine and iodine; and generating a plasma of said reactive gas by electronic cyclotron resonance so as to produce reactive ions from said reactive gas which reactive ions selectively remove or transmute only said contaminates sticking on said sidewall of said pattern or said trench while avoiding etching of said substrate.

2. The method according to claim 1, wherein a gas selected from the group consisting of oxygen, nitrogen, hydrogen and ammonia is mixed into said reactive gas, and plasma of this mixed gas is produced by said electronic cyclotron resonance.

3. The method according to claim 1, wherein the step of producing plasma of said reactive gas by said electronic cyclotron resonance comprises the steps of:

supplying a microwave into said processing container in which said reactive gas is introduced, and producing a magnetic field in said processing container.

4. A method of cleaning semiconductor devices which selectively removes or transmutes contaminates sticking on a sidewall of a pattern or a trench, comprising the steps of:

locating a substrate to be treated on which said pattern or trench is formed into a processing container;

introducing a reactive gas into said processing container;

introducing krypton or xenon into said processing container together with said reactive gas; and generating a plasma of said reactive gas by electronic cyclotron resonance so as to produce reactive ions from said reactive gas which reactive ions selectively remove or transmute only said contaminates sticking on the sidewall of said pattern or trench while avoiding etching of said substrate.

5. The method according to claim 4, wherein said krypton or xenon is introduced in a mixed gas containing said reactive gas and said krypton or xenon at a flow rate ratio of 25–75%.

6. The method according to claim 4, wherein said reactive gas includes a gas including an element selected from the group consisting of fluorine, chlorine, bromine and iodine.

7. The method according to claim 4, wherein a gas selected from the group consisting of oxygen, nitrogen, hydrogen and ammonia is further mixed into said reactive gas, and a plasma of this mixed gas is produced by said electronic cyclotron resonance.

8. The method according to claim 4, wherein the step of producing plasma of said reactive gas by said electronic cyclotron resonance comprises the steps of:

supplying a microwave into said processing container in which said reactive gas is introduced, and producing a magnetic field in said processing container.

9. The method of cleaning semiconductor devices according to claim 4, wherein in said step of producing a plasma of said reactive gas by electronic cyclotron resonance, a direction of providing said reactive ions is uncontrolled and a plurality of said reactive ions impact said substrate and said sidewall of said pattern or said trench at a plurality of different angles.

10. The method of cleaning semiconductor devices according to claim 1, further including the step of introducing krypton or xenon into said processing container together with said reactive gas.

* * * * *